(12) United States Patent
Tsorng et al.

(10) Patent No.: US 10,517,189 B1
(45) Date of Patent: Dec. 24, 2019

(54) APPLICATION AND INTEGRATION OF A CABLELESS SERVER SYSTEM

(71) Applicant: QUANTA COMPUTER INC., Taoyuan (TW)

(72) Inventors: Yaw-Tzorng Tsorng, Taoyuan (TW); Chun Chang, Taoyuan (TW); Hsin-Chieh Lin, Taoyuan (TW); Chih-Hao Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/295,827

(22) Filed: Mar. 7, 2019

Related U.S. Application Data

(60) Provisional application No. 62/723,230, filed on Aug. 27, 2018.

(51) Int. Cl.
| | |
|---|---|
| H05K 5/00 | (2006.01) |
| H05K 7/00 | (2006.01) |
| G11B 33/02 | (2006.01) |
| H05K 7/14 | (2006.01) |
| H05K 7/02 | (2006.01) |
| H05K 7/20 | (2006.01) |

(52) U.S. Cl.
CPC ......... *H05K 7/1492* (2013.01); *H05K 5/0026* (2013.01); *H05K 7/02* (2013.01); *H05K 7/1487* (2013.01); *H05K 7/20172* (2013.01)

(58) Field of Classification Search
CPC ..................................................... G11B 33/02
See application file for complete search history.

(56) References Cited

U.S. PATENT DOCUMENTS

| | | | | |
|---|---|---|---|---|
| 10,282,330 | B2* | 5/2019 | Khan | G06F 13/362 |
| 10,318,461 | B2* | 6/2019 | Patel | G06F 13/4027 |
| 2006/0048001 | A1* | 3/2006 | Honda | G11B 33/142 |
| | | | | 714/6.32 |
| 2011/0222227 | A1* | 9/2011 | Xu | G06F 1/181 |
| | | | | 361/679.4 |
| 2016/0306922 | A1* | 10/2016 | van Rooyen | H04L 67/10 |
| 2017/0270245 | A1* | 9/2017 | van Rooyen | G16B 50/00 |
| 2018/0240032 | A1* | 8/2018 | van Rooyen | G06N 7/005 |

* cited by examiner

*Primary Examiner* — Jerry Wu
(74) *Attorney, Agent, or Firm* — Nixon Peabody LLP; Zhou Lu

(57) ABSTRACT

The present disclosure provides a system and method for enabling cableless connections within a server system. The server system comprises a motherboard (MB) module, a power distribution board (PDB) module, power supply unit (PSU) modules, network interface controller (NIC) modules, fan modules, graphic process unit (GPU) modules, and a hyperscale GPU accelerator (HGX) platform. These components of the server system are interconnected by a plurality of circuit boards. The plurality of circuit boards includes, but is not limited to, a main board, linking boards (BDs), a PDB, a fan board, a power linking board, peripheral-component-interconnect-express (PCIe) expander boards, a plurality of NVLink bridges, and HGX base boards.

3 Claims, 24 Drawing Sheets

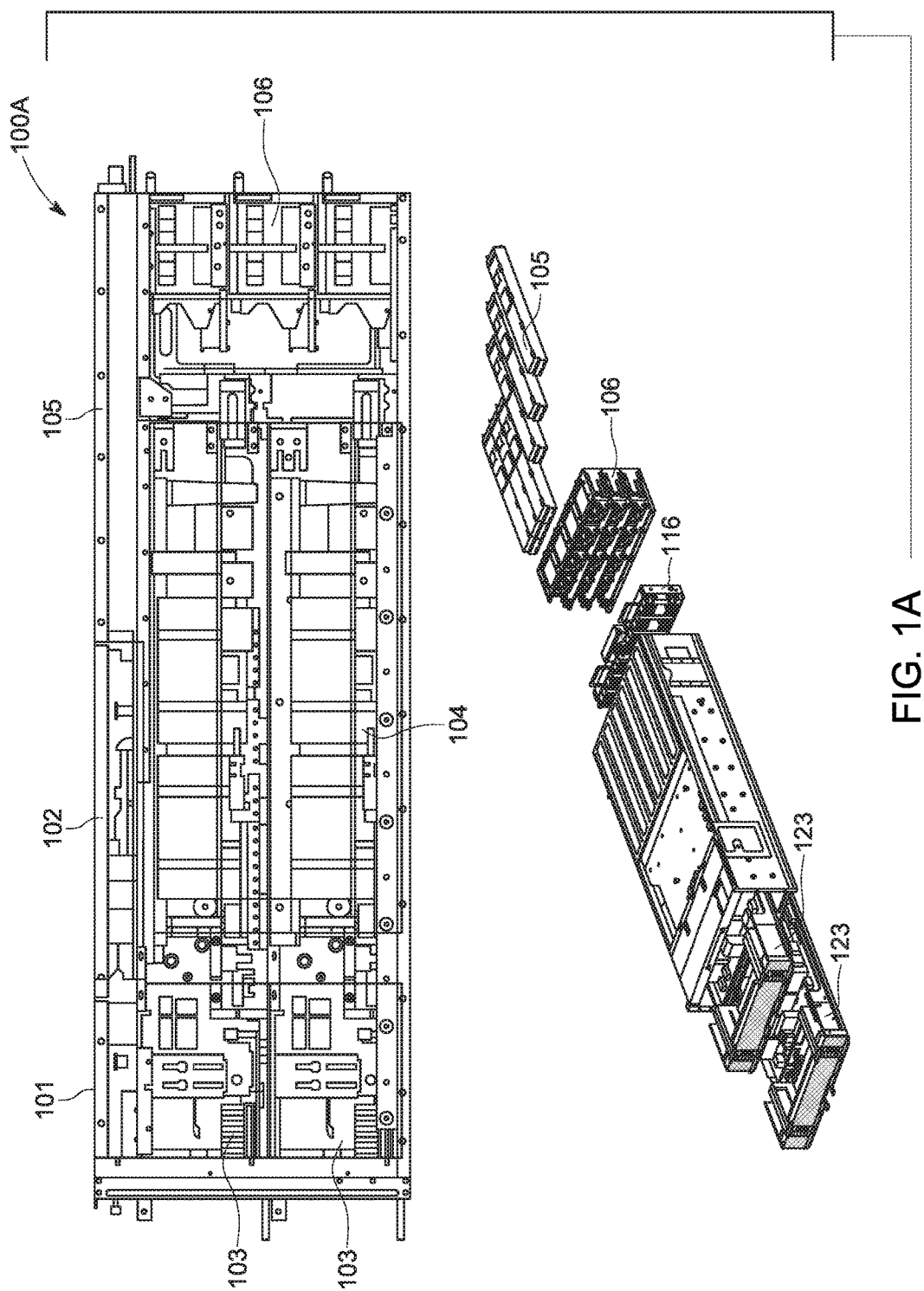

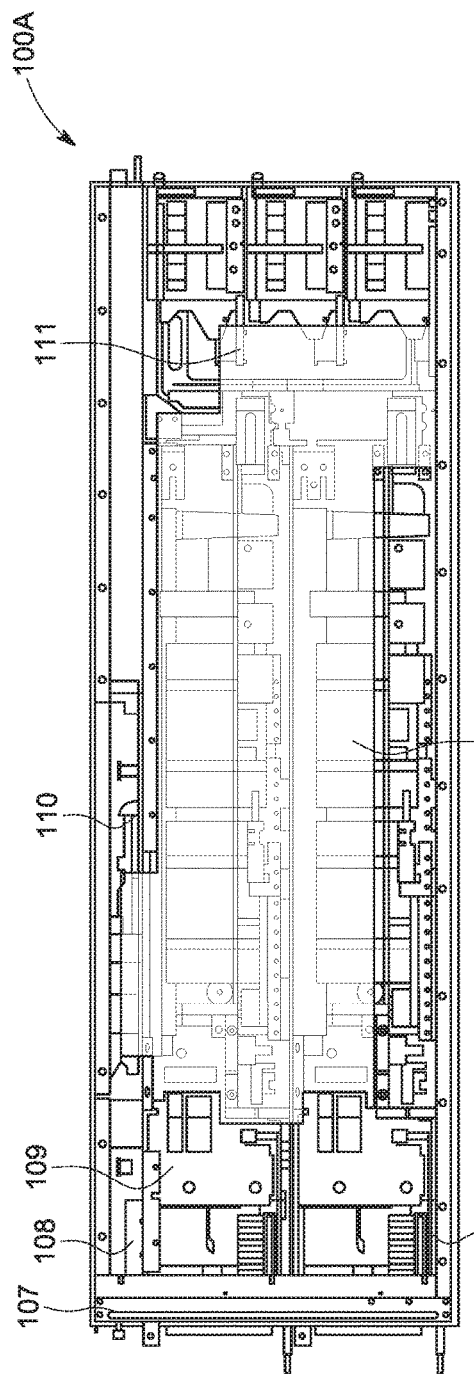
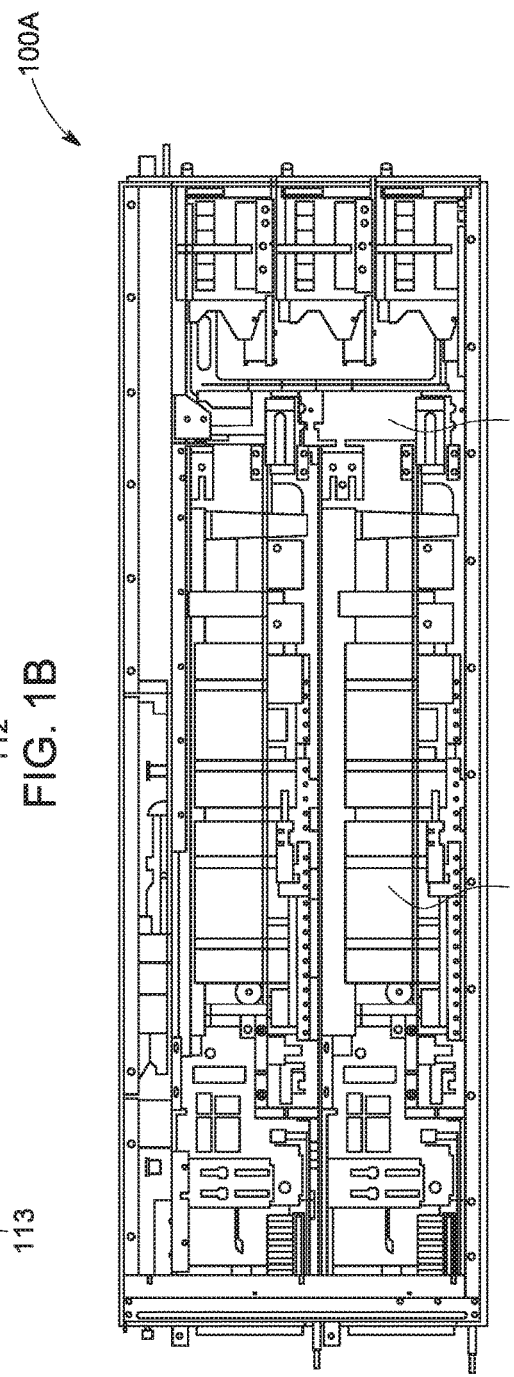
FIG. 1B
FIG. 1C

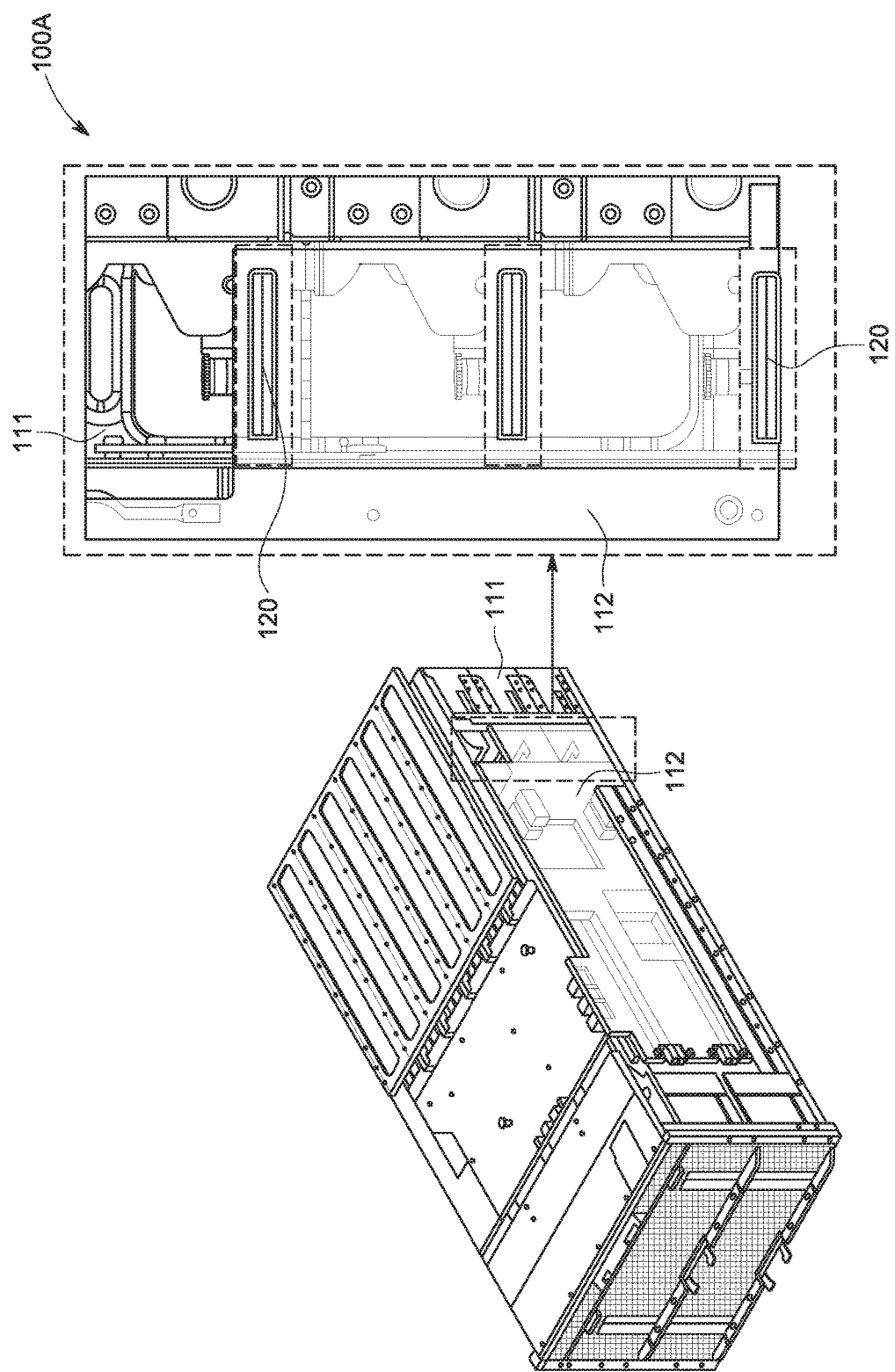

APPLICATION AND INTEGRATION OF A CABLELESS SERVER SYSTEM

CROSS REFERENCE TO RELATED APPLICATIONS

This application claims priority under 35 U.S.C. § 119 of Provisional application Ser. No. 62/723,230, filed Aug. 27, 2018 entitled "THE APPLICATION AND INTEGRATION OF CABLE-LESS SERVER SYSTEM", the entire disclosure of which is herein incorporated by reference.

FIELD OF THE INVENTION

The disclosure generally relates to computer server systems, more particularly to cableless server systems.

BACKGROUND

Modern computing systems comprise numerous electronic circuit boards and components. Traditionally, a plurality of cables is used to interconnect these electronic circuit boards or at least some of these electronic components. However, connecting via cables requires connectors. As a server system becomes more complex, and incorporates more electronic circuit boards and components, it can be difficult to locate a large number of connectors for cable connections inside the server system. Also, cables are subject to inadvertent impingement due to moving parts within the server system. Thus, maintaining and verifying these cable connections can be challenging.

SUMMARY

Systems and methods, in accordance with various examples of the present disclosure, provide a solution to the above-mentioned problems by enabling cableless connections within a server system. The server system comprises a motherboard (MB) module, a power distribution board (PDB) module, power supply unit (PSU) modules, network interface controller (NIC) modules, fan modules, graphic process unit (GPU) modules, and a hyperscale GPU accelerator (HGX) platform. These components of the server system are interconnected by a plurality of circuit boards. The plurality of circuit boards includes, but is not limited to, a main board, linking boards (BDs), a PDB, a fan board, a power linking board (e.g., a PSU linking board), peripheral-component-interconnect-express (PCIe) expander boards, a plurality of NVLink bridges (e.g., NVLink boards), and HGX base boards.

In accordance with one aspect of the present disclosure, a computer-implemented method for assembling a cableless server system, comprises: inserting a power distribution board (PDB) module, a power linking board, and a plurality of NVLink bridges onto a first side, a second side, and a rear side of the server system, respectively, the server system comprising a motherboard (MB) module, power supply unit (PSU) modules, network interface controller (NIC) modules, fan modules, graphic process unit (GPU) modules, and a hyperscale GPU accelerator (HGX) platform, wherein components of the server system are interconnected via a main board, linking boards (BDs), a PDB, a fan board, the power linking board, a peripheral-component-interconnect-express (PCIe) expander board, the plurality of NVLink bridges, and a HGX base board; inserting the GPU modules from a front side of the server system, each of the GPU modules comprising a linking board; connecting the power linking board to a corresponding linking board of each of the GPU modules; installing a fan bay main module from the rear side of the server system, and the MB module from the front side of the server system; connecting the main board to the PDB; connecting the fan board to the power linking board; inserting the PSU modules into the rear side of the server system; and connecting the PSU modules to an AC power source to deliver power to the server system.

One other aspect of the present disclosure is a computer-implemented method for assembling a cableless server system. A power distribution board (PDB) module, a power linking board, and a plurality of NVLink bridges are inserted onto a first side, a second side, and a rear side of the server system, respectively. The server system comprises a motherboard (MB) module, power supply unit (PSU) modules, network interface controller (NIC) modules, fan modules, graphic process unit (GPU) modules, and a hyperscale GPU accelerator (HGX) platform. The components of the server system are interconnected via a main board, linking boards (BDs), a PDB, a fan board, the power linking board, a peripheral-component-interconnect-express (PCIe) expander board, the plurality of NVLink bridges, and a HGX base board. The GPU modules are inserted from a front side of the server system, with each of the GPU modules comprising a linking board. The power linking board is connected to a corresponding linking board of each of the GPU modules. A fan bay main module is installed from the rear side of the server system, and the MB module is installed from the front side of the server system. The main board connects to the PDB, and the fan board is connected to the power linking board. The PSU modules are inserted into the rear side of the server system. The PSU modules are connected to an AC power source to deliver power to the server system.

In accordance with another aspect of the present disclosure, a non-transitory computer-readable storage medium storing instructions is provided. The instructions, when executed by a processor of a cableless server system, cause the processor to perform operations including: inserting a power distribution board (PDB) module, a power linking board, and a plurality of NVLink bridges onto a first side, a second side, and a rear side of the server system, respectively, the server system comprising a motherboard (MB) module, power supply unit (PSU) modules, network interface controller (NIC) modules, fan modules, graphic process unit (GPU) modules, and a hyperscale GPU accelerator (HGX) platform, wherein components of the server system are interconnected via a main board, linking boards (BDs), a PDB, a fan board, the power linking board, a peripheral-component-interconnect-express (PCIe) expander board, the plurality of NVLink bridges, and a HGX base board; inserting the GPU modules from a front side of the server system, each of the GPU modules comprising a linking board; connecting the power linking board to a corresponding linking board of each of the GPU modules; installing a fan bay main module from the rear side of the server system, and the MB module from the front side of the server system; connecting the main board to the PDB; connecting the fan board to the power linking board; inserting the PSU modules into the rear side of the server system; and connecting the PSU modules to an AC power source to deliver power to the server system.

A third aspect of the present disclosure is a non-transitory computer-readable storage medium storing instructions. The instructions, when executed by a processor of a cableless server system, cause the processor to perform certain operations. A power distribution board (PDB) module, a power linking board, and a plurality of NVLink bridges are inserted onto a first side, a second side, and a rear side of the server system, respectively. The server system comprises a motherboard (MB) module, power supply unit (PSU) modules, network interface controller (NIC) modules, fan modules, graphic process unit (GPU) modules, and a hyperscale GPU accelerator (HGX) platform. The components of the server system are interconnected via a main board, linking boards (BDs), a PDB, a fan board, the power linking board, a peripheral-component-interconnect-express (PCIe) expander board, the plurality of NVLink bridges, and a HGX base board. The GPU modules are inserted from a front side of the server system, with each of the GPU modules comprising a linking board. The power linking board is connected to a corresponding linking board of each of the GPU modules. A fan bay main module is installed from the rear side of the server system, and the MB module is installed from the front side of the server system. The main board is connected to the PDB, and the fan board is connected to the power linking board. The PSU modules are inserted into the rear side of the server system. The PSU modules are connected to an AC power source to deliver power to the server system.

Additional features and advantages of the disclosure will be set forth in the description that follows, and will in part be obvious from the description; or can be learned by the practice of the principles set forth herein. The features and advantages of the disclosure can be realized and obtained by means of the instruments and combinations particularly pointed out in the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims:

FIGS. 1A-1C illustrate a schematic block diagram of an exemplary cableless server system, in accordance with an implementation of the present disclosure;

DETAILED DESCRIPTION

Figure 2A:
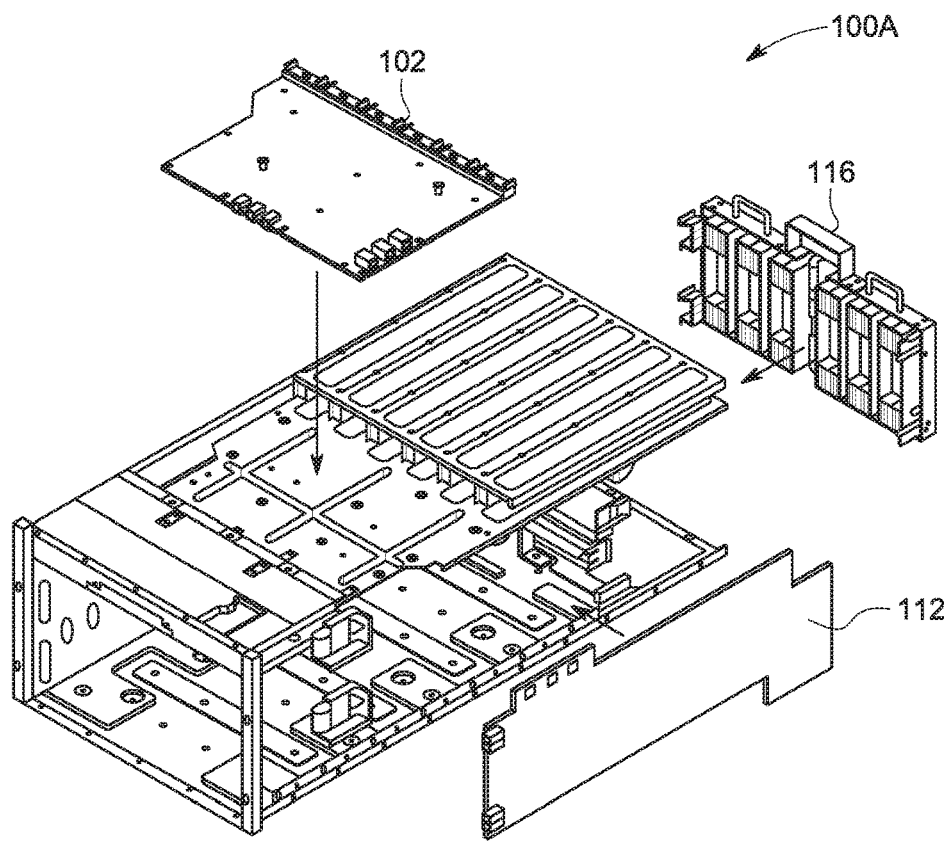
FIGS. 2A-2V illustrate the exemplary cableless server system of FIG. 1A in individual assembly steps, in accordance with an implementation of the present disclosure.

The present disclosure can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Various examples of the present disclosure provide systems and methods for enabling cableless connections within a server system. The server system comprises a MB module, a PDB module, PSU modules, NIC modules, fan modules, GPU modules, and a HGX platform. These components of the server system are interconnected by a plurality of circuit boards. The plurality of circuit boards includes a main board, linking BDs, a PDB, a fan board, the power linking board, a PCIe expander board, the plurality of NVLink bridges, and a HGX base board.

Figure 2B:
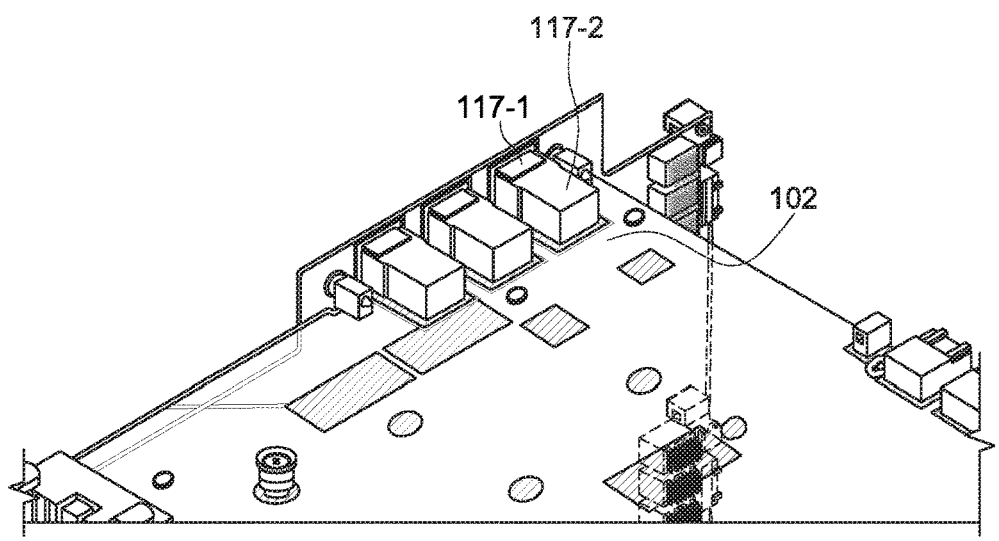
Figure 2C:
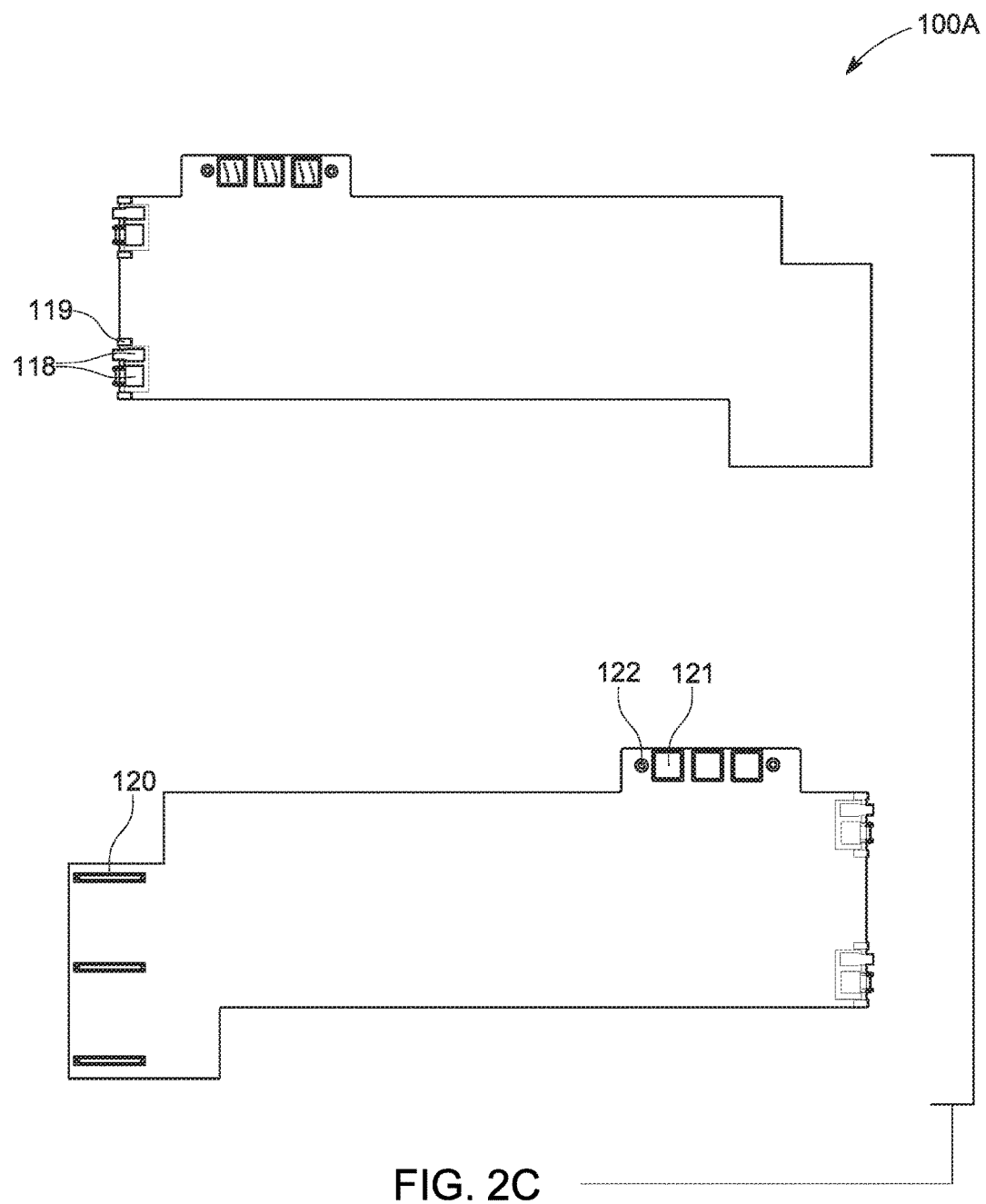
Figure 2D:
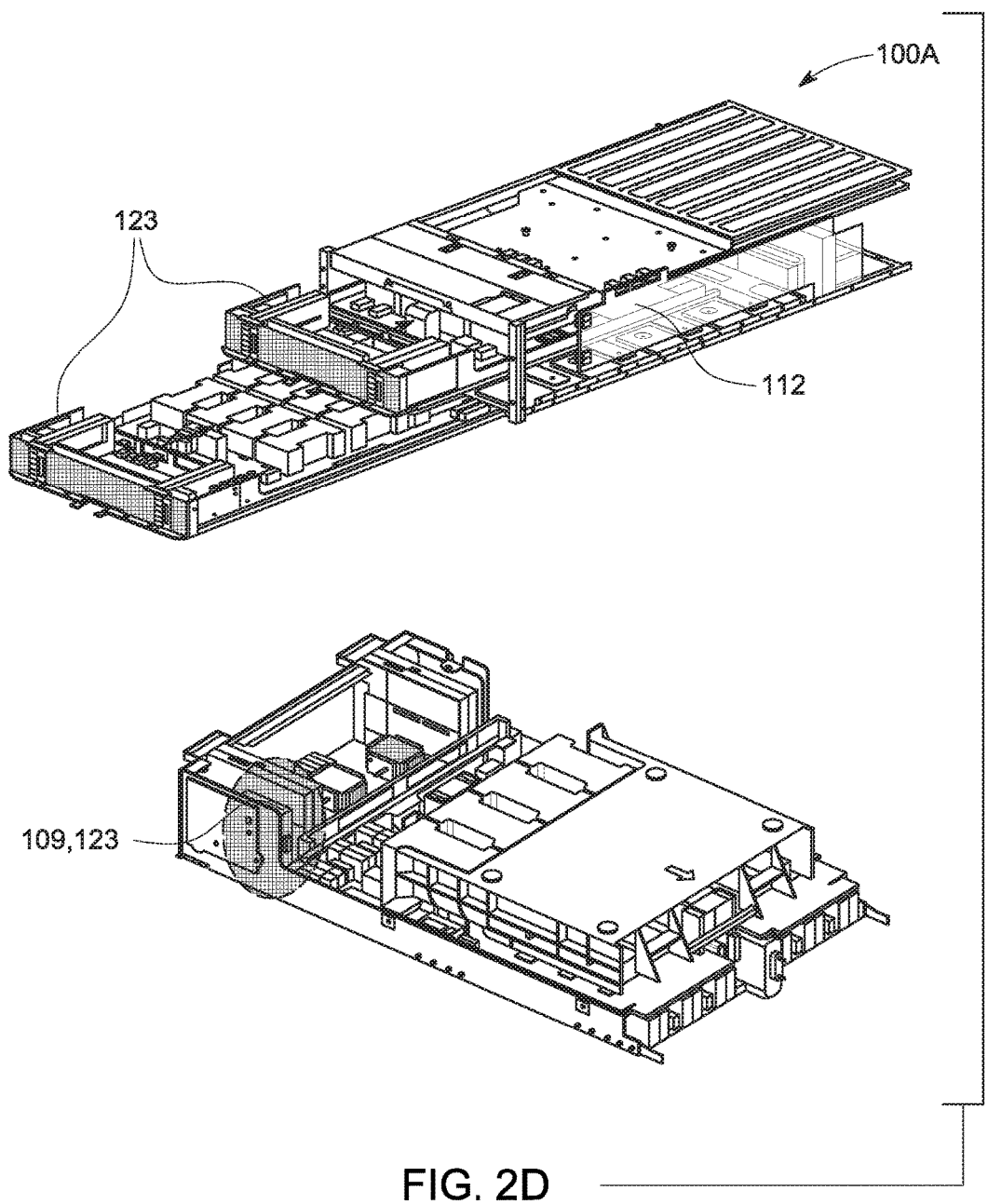
Figure 2E:
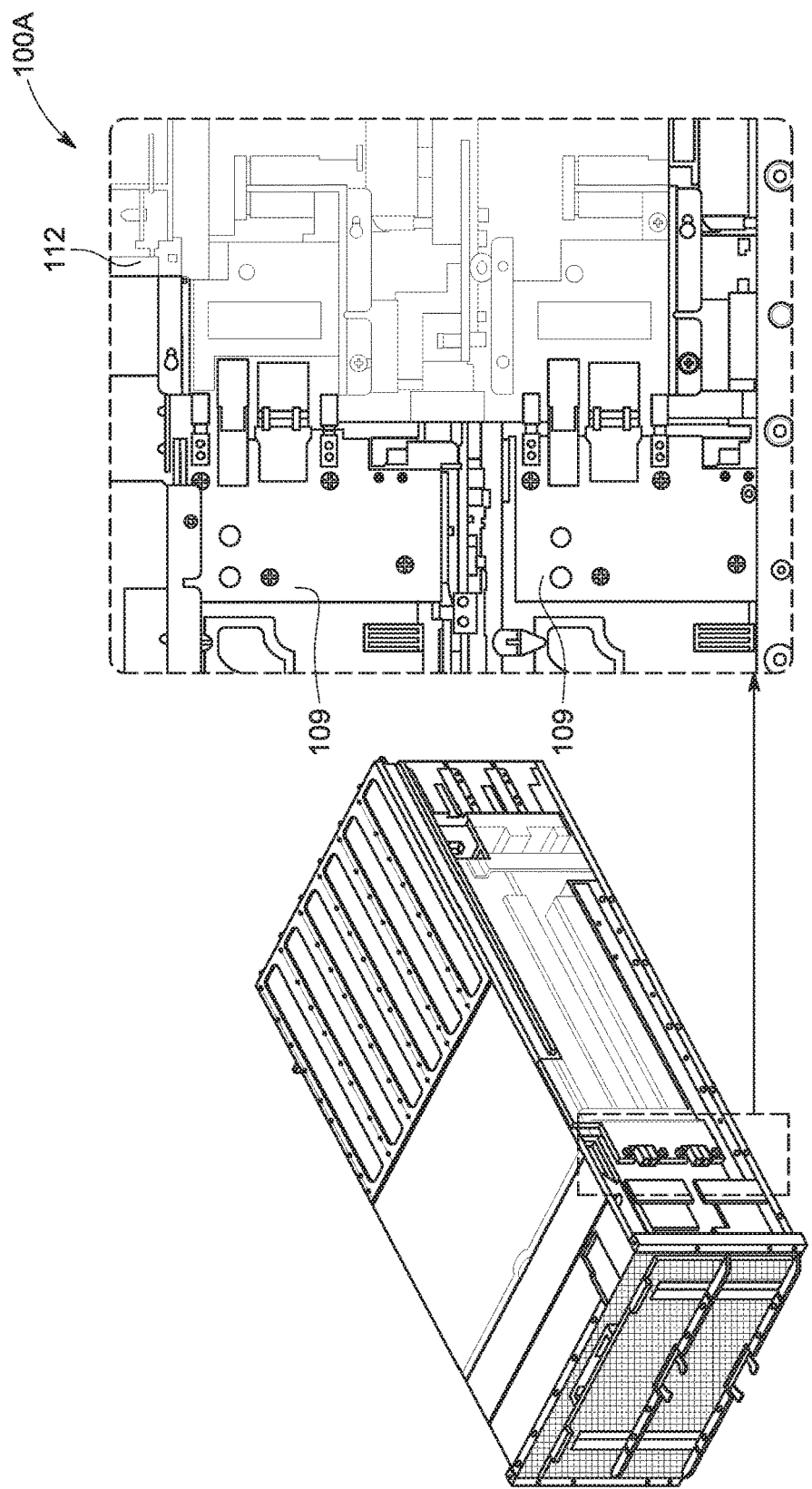
Figure 2F:
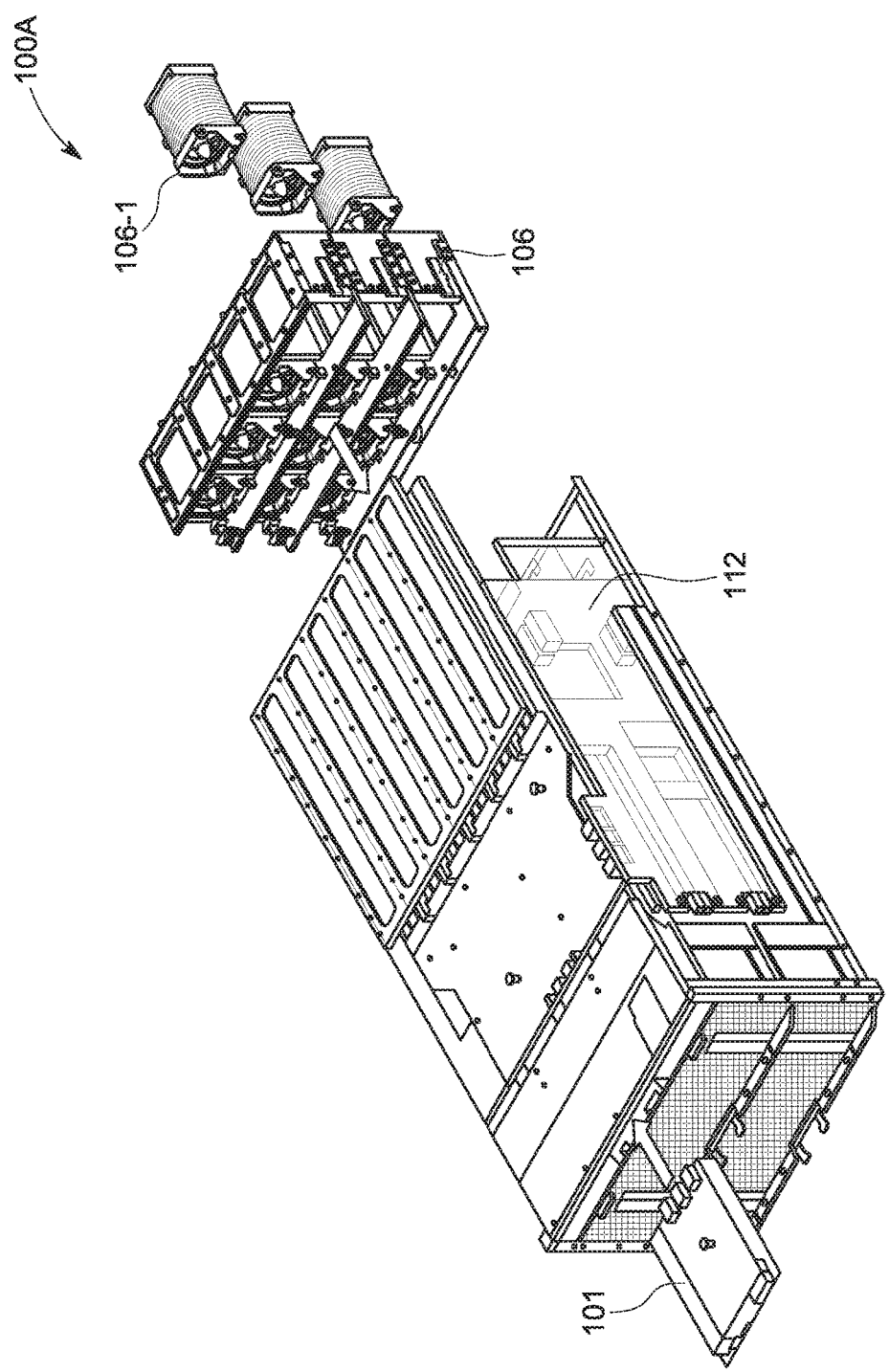
Figure 2H:
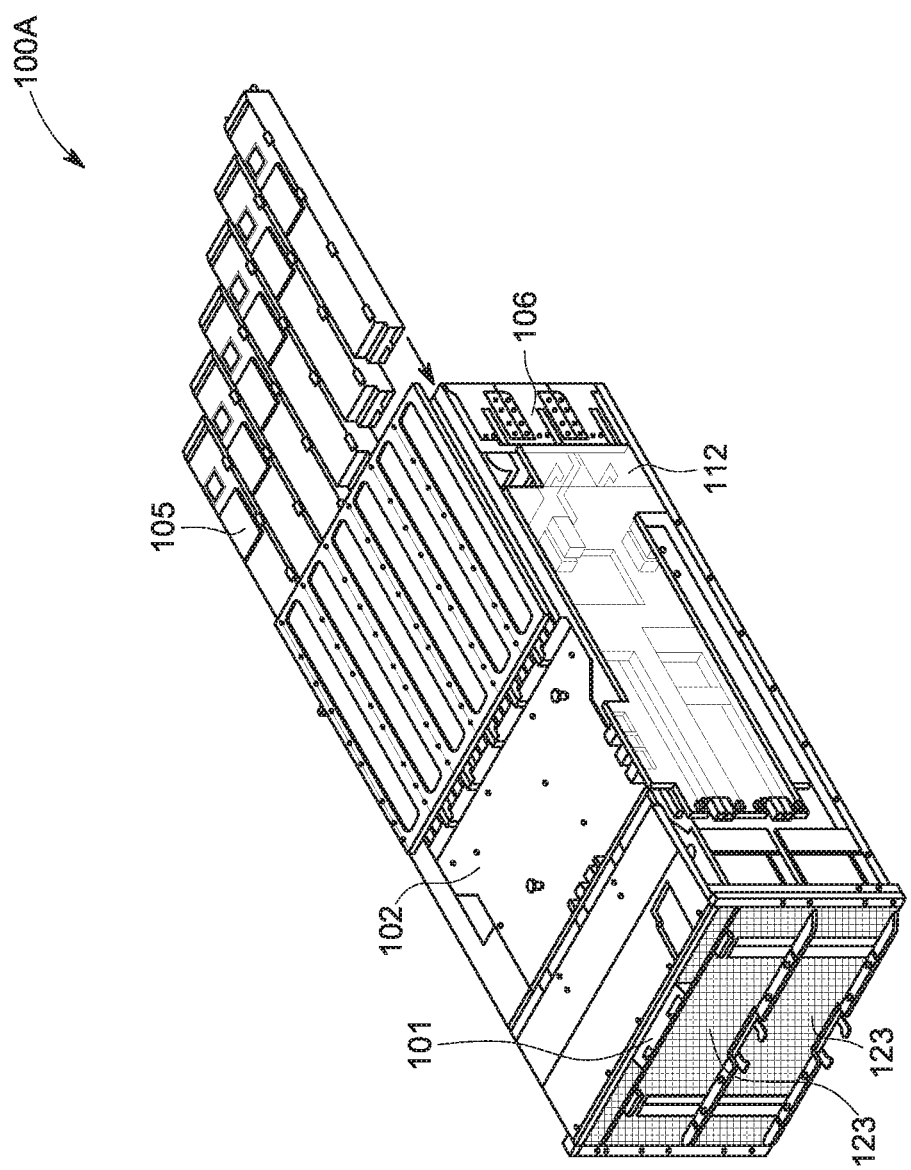
Figure 2I:
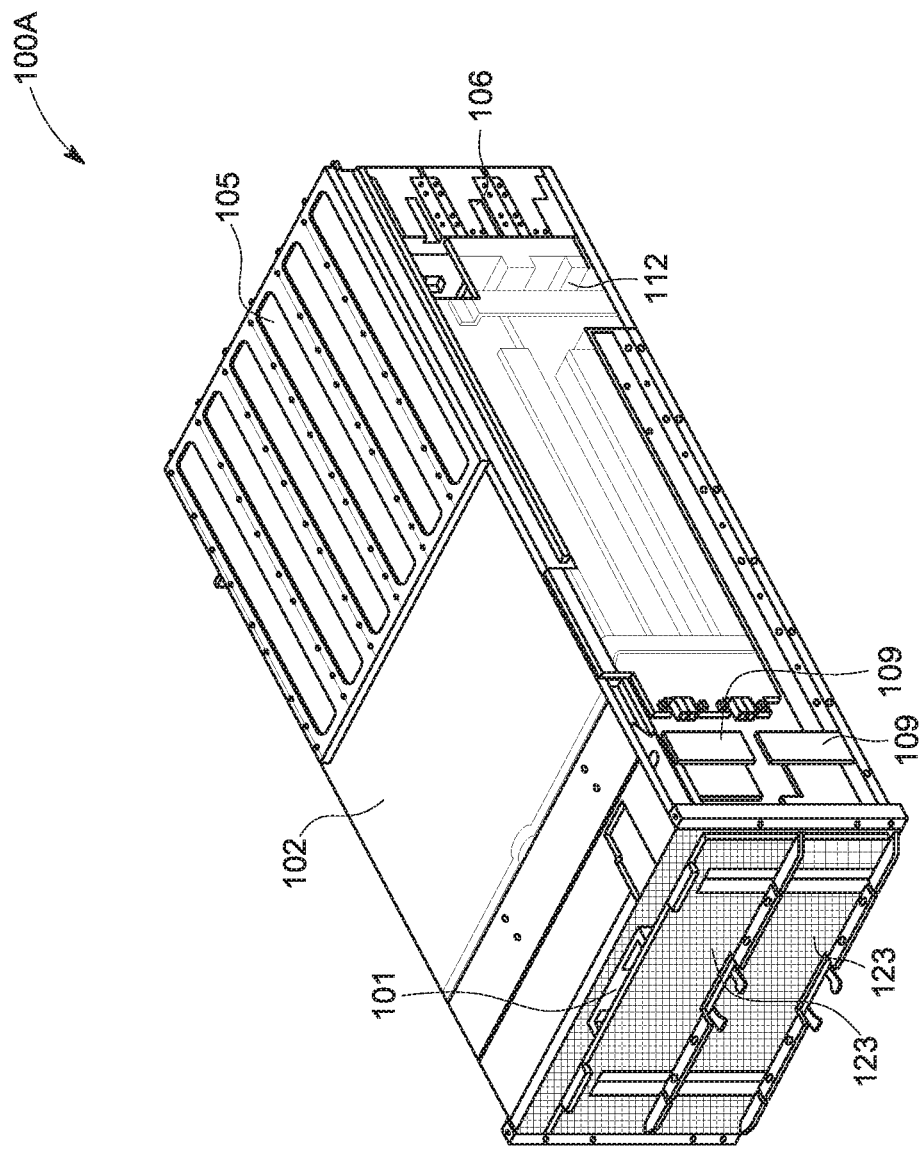

FIG. 1A illustrates a schematic block diagram of an exemplary cableless server system 100A, in accordance with an implementation of the present disclosure. In this example, the server system 100A includes a MB module 101, a PDB module 102, PSU modules 105, NIC modules 103, fan bay main modules 106, GPU modules 123 (e.g., HGX2 modules), and HGX platforms 104. The PSU modules 105 are configured to receive an AC power from an AC power supply, and provide power to various components of the server system 100A. The HGX platforms 104 are cloud server platforms for artificial intelligence (AI) and high-performance computing (HPC). The NIC modules 103 are configured to connect the server system 100A to a computer network. The NIC modules 103 and the HGX2 modules (e.g., GPU modules) are connected via ExaMax connectors 203, as illustrated in FIGS. 2N and 2O. GPU modules are inter-connected via Linking BD-1 109, as illustrated in FIG. 2E. In this example, fan modules are connected via power linking board 112, as illustrated in FIG. 2G. The GPU modules 123 and the NVLink bridges are connected via ExaMax connectors 201, as illustrated in FIG. 2K. The GPU modules 123 and the link BD-1 109 are connected via AirMax power connectors 118, as illustrated in FIG. 2L. The fan board 111 and the power linking board 112 are connected via fan power connectors 120, as illustrated in FIG. 2G.

In some implementations, the GPU modules 123 or FPGAs are connected to a processor of the server system 100A via PCIe switches. The PCIe switches enable high-speed serial point-to-point connections among multiple I/O devices, GPUs modules 123 or FPGAs, and the processor for optimized aggregation, fan-out, or peer-to-peer communication of end-point traffic to a host.

FIGS. 1B and 1C illustrate schematic block diagrams of a plurality of circuit boards that connect various components of the exemplary cableless server system 100A, in accordance with an implementation of the present disclosure. In this example, the plurality of circuit boards comprises a main board 108, linking BDs 109, a PDB 110, fan boards 111, a power link board or bridge 112, PCIe expander boards 113, a plurality of NVLink bridges or boards 115, and HGX base boards 114. The main board 108, the linking BDs 109, the PDB 110, and the fan boards 111 are placed next to each other ranging from a front panel 107 to a rear side of the server system 100A. The main board 108 is configured to provide system control (e.g., baseboard management controller (BMC)). The PDB 110 is configured to provide main power distribution and management. The NVLink bridges 115 can provide signal transfer for HGX2. The linking BDs 109 can transfer signals and power within the PDB 110 and PCIe expander boards 113. The PCIe expander boards 113 can support 100G network interface card. For example, the PCIe expander boards 113 can be PCIe GEN3/4. The power linking board 112 can transfer and manage a main power source to all systems. The fan board 111 can manage power delivered to fans within the system 100A, and control fan speeds of the fans.

Figure 2J:
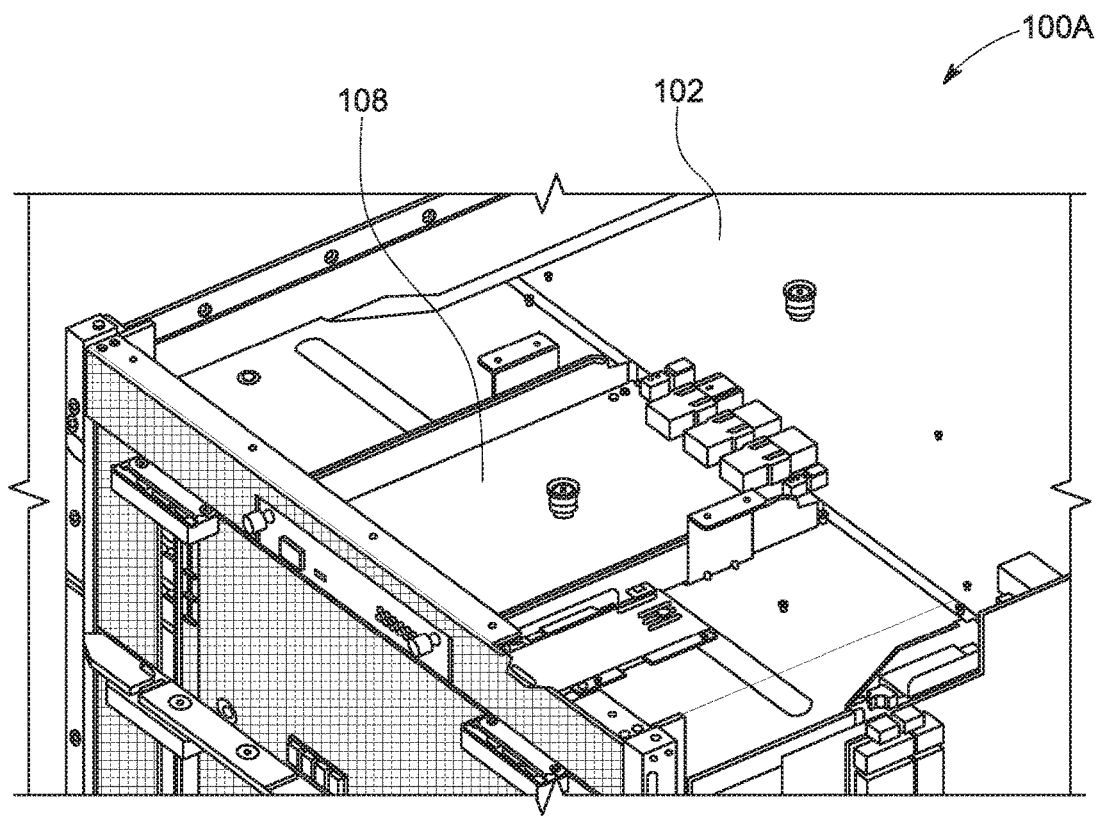
Figure 2K:
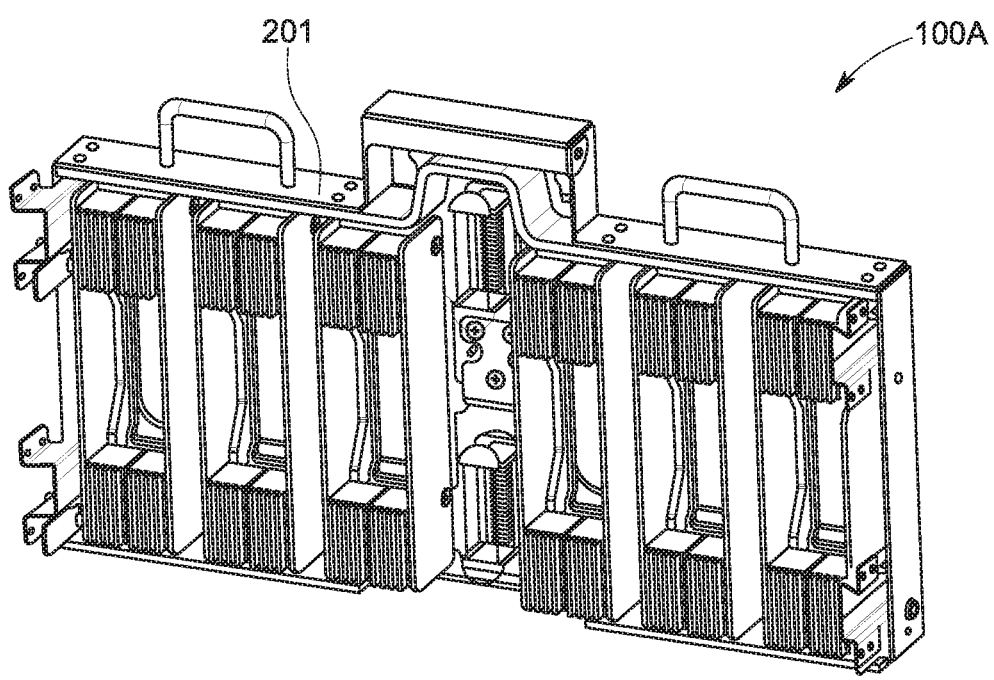
Figure 2L:
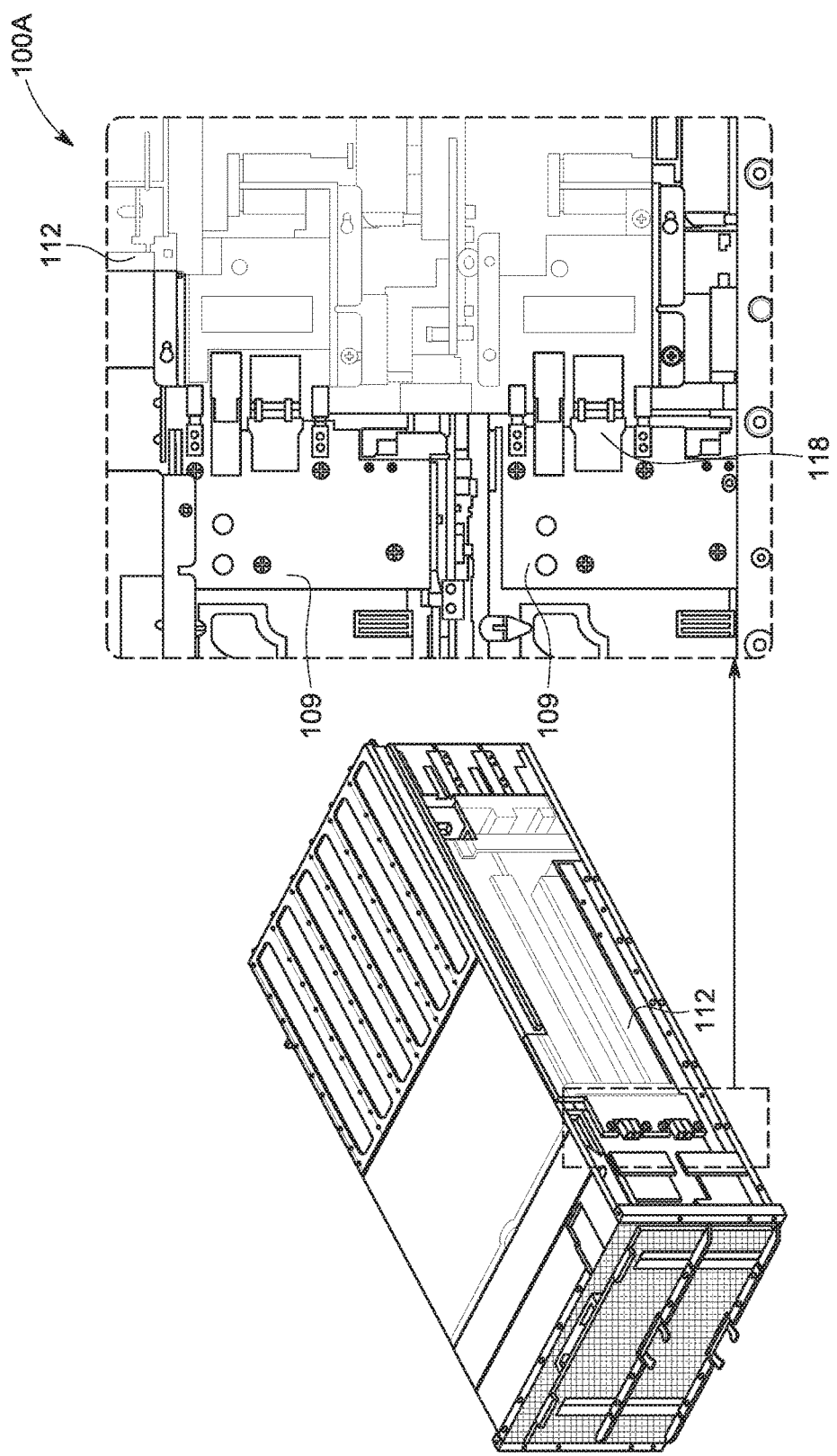
Figure 2M:
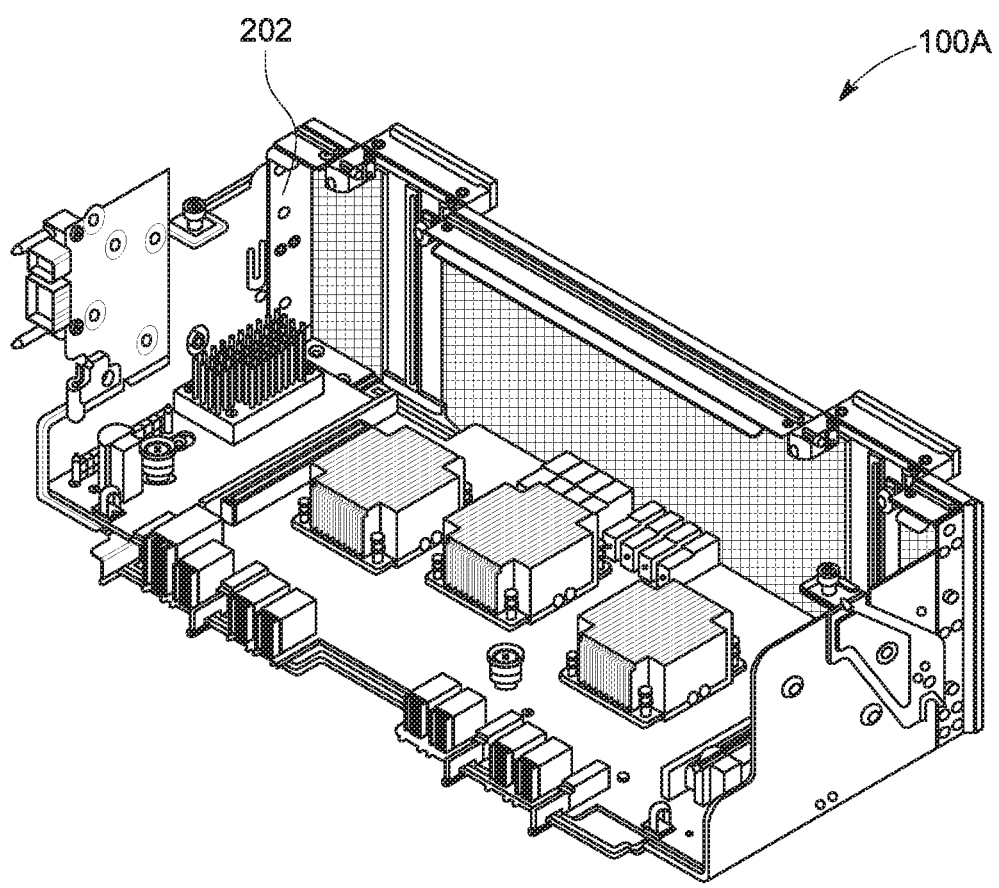
Figure 2N:
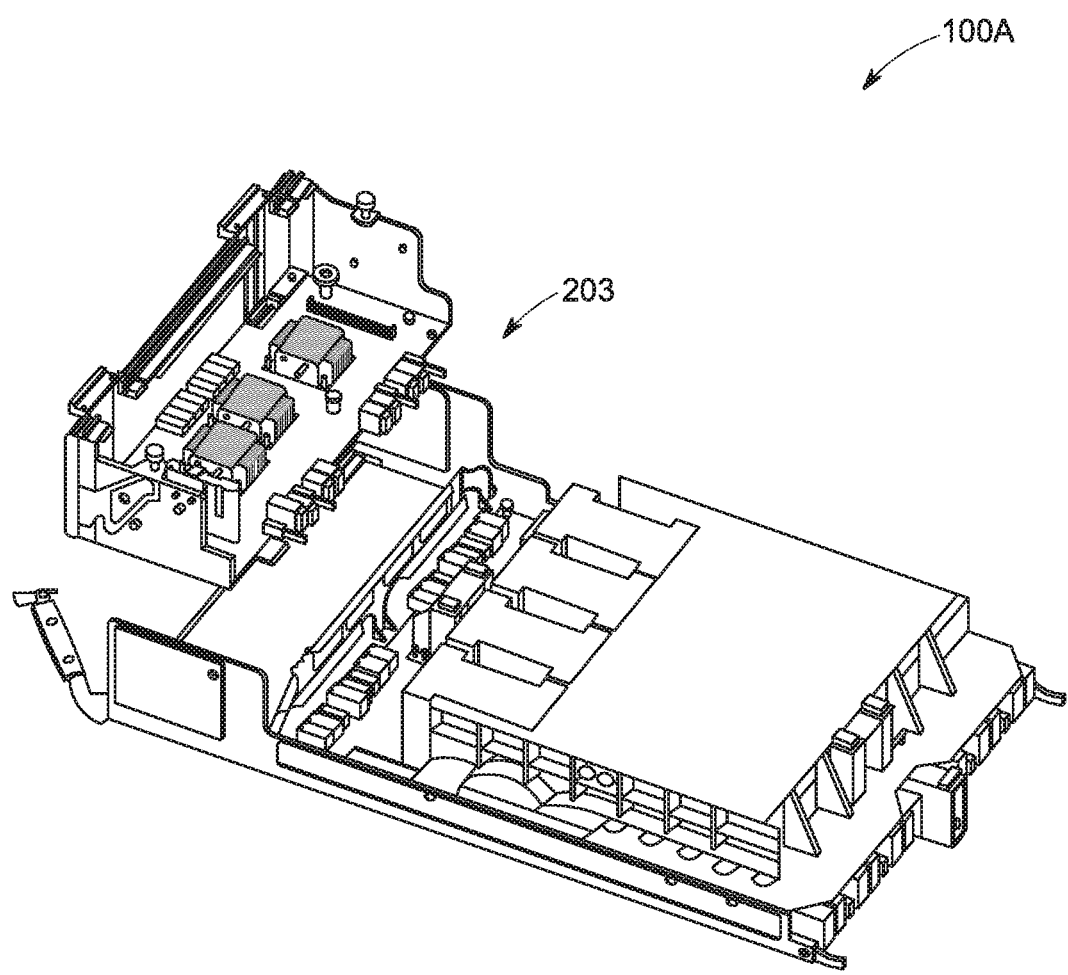
Figure 2O:
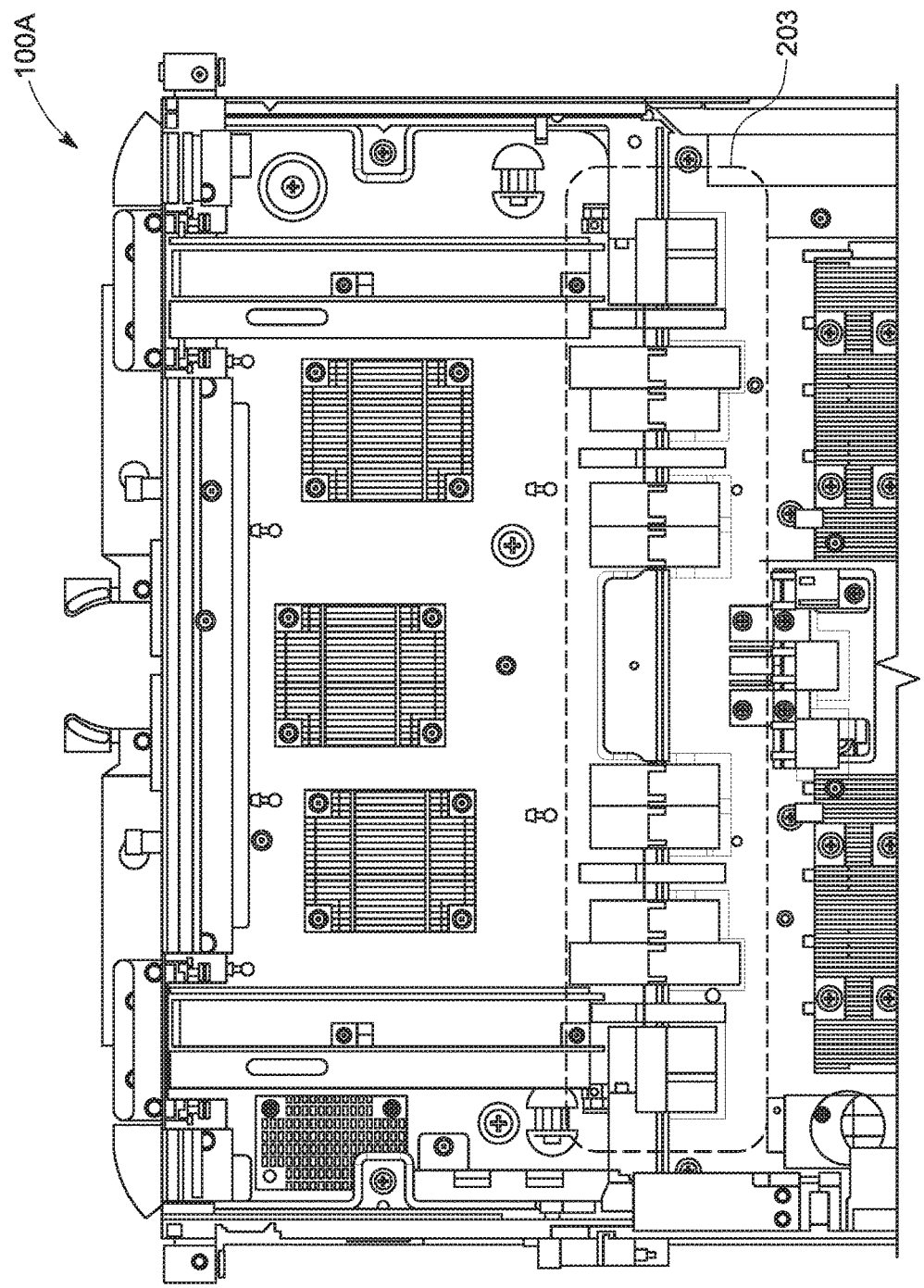

In this example, the main board 108 and the PDB module 102 are connected via a high density power connector, as illustrated in FIG. 2J. The PCIe expander boards 113 are placed between the front panel 107 and the power link board or bridge 112. The PCIe expander boards 113 and the linking BD 109 are connected via PCIe express connector 202, as illustrated in FIG. 2M. The plurality of NVLink bridges or boards 115 are situated close to the rear side of the server system 100A, and are configured to transfer signals within the HGX2 modules without providing power. The power link board 112 and the HGX base boards 114 (e.g., GPU boards) are located between the PCIe expander boards 113 and the plurality of NVLink bridges or boards 115.

FIGS. 2A-2I illustrate the exemplary cableless server system 100A of FIG. 1A in individual assembly steps, in accordance with an implementation of the present disclosure. FIG. 2A illustrates that the PDB module 102, the power linking board 112, and the NVlink board or bridge 116 are being inserted onto side walls and a rear side of the server system 100A, respectively. In this example, the PDB module 102 is inserted into a first side wall; the power linking board 112 is inserted into a second side wall; and the NVlink board or bridge 116 is inserted onto the rear side of the server system 100A. The PDB module 102 is connected to the power linking board 112 via connectors. The connections between the PDB module 102 and the power linking board 112 is further illustrated in FIG. 2B. As illustrated in FIG. 2B, the PDB module 102 and the power linking board 112 are connected via high speed orthogonal connectors (e.g., ExaMax Power Connectors 117-1 and 117-2).

Figure 2P:
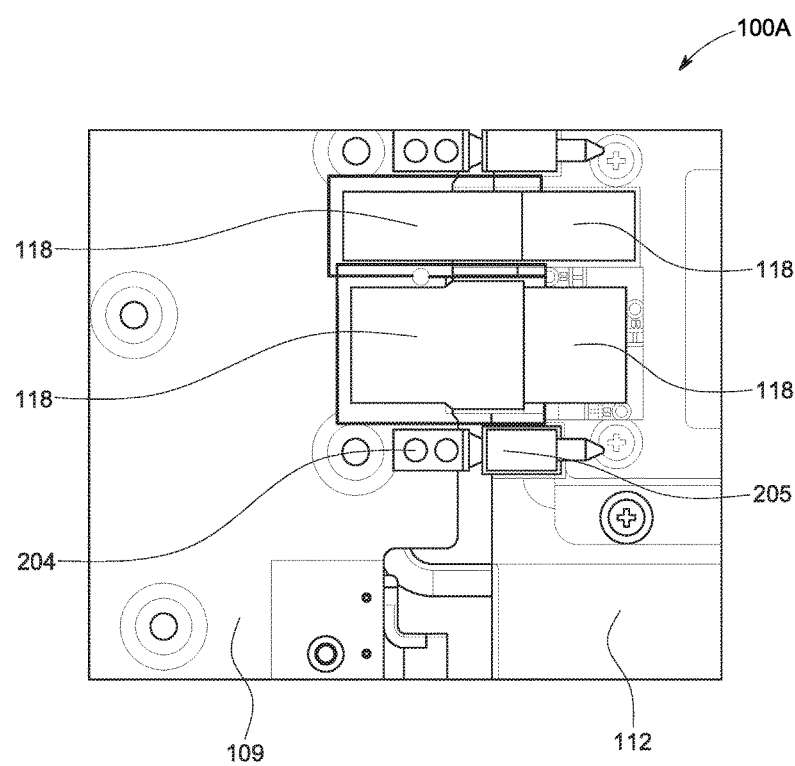

FIG. 2C further illustrates connectors of the power linking board 112. In this example, the power linking board 112 further includes orthogonal connectors (e.g., AirMax connectors 118), guiding pins 119, fan power connectors 120, power connectors 121, and guiding pins 122. The AirMax connectors 118 of the linking BD 109 are connected to AirMax connectors of the power linking board 112. The guiding pins 119 are configured to facilitate connection between the linking BD 109 and the power linking board 112. The connection between the linking BD 109 and the power linking board 112 are further illustrated in FIG. 2P. In FIG. 2P, AirMax connectors 118 are used to connect the linking BD-1 and the power linking board 112, together with the guide pin 204 and guiding holder 205.

Figure 2Q:
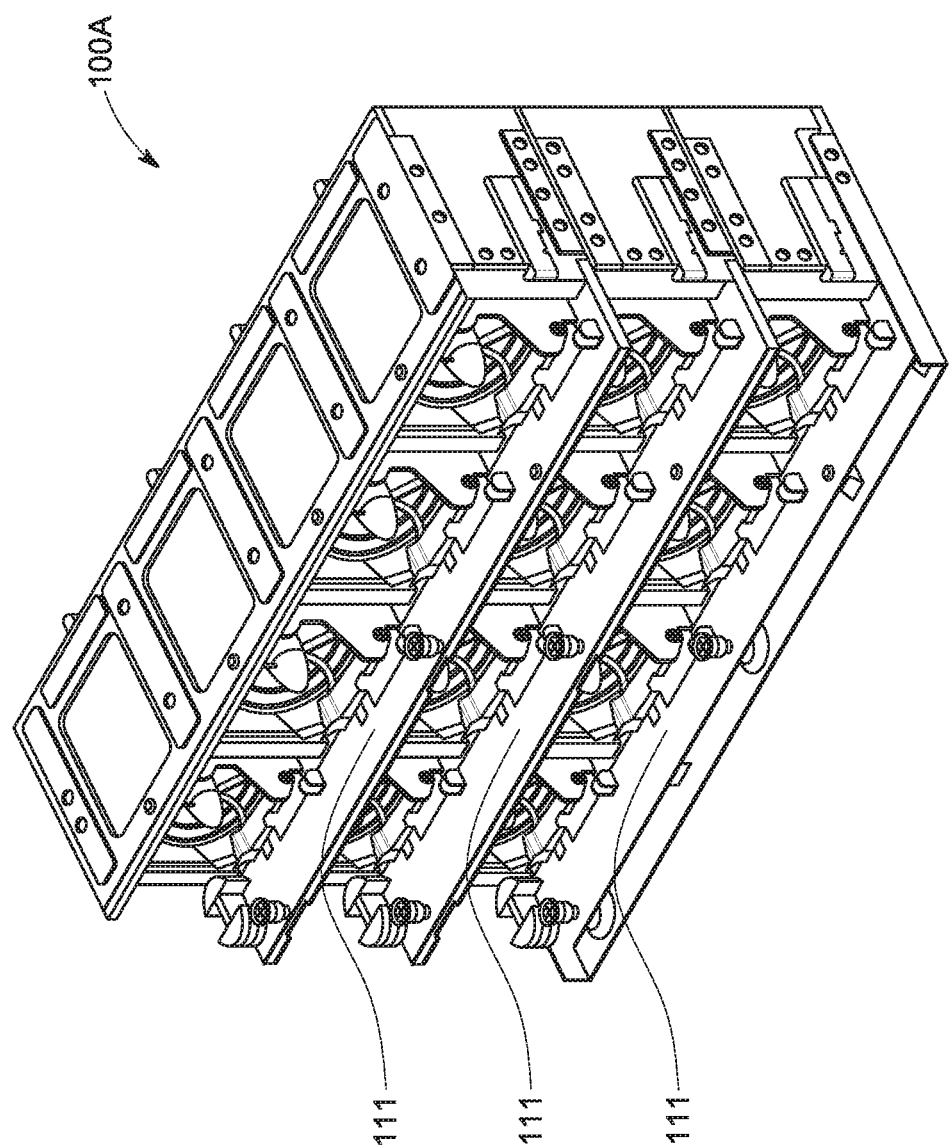
Figure 2R:
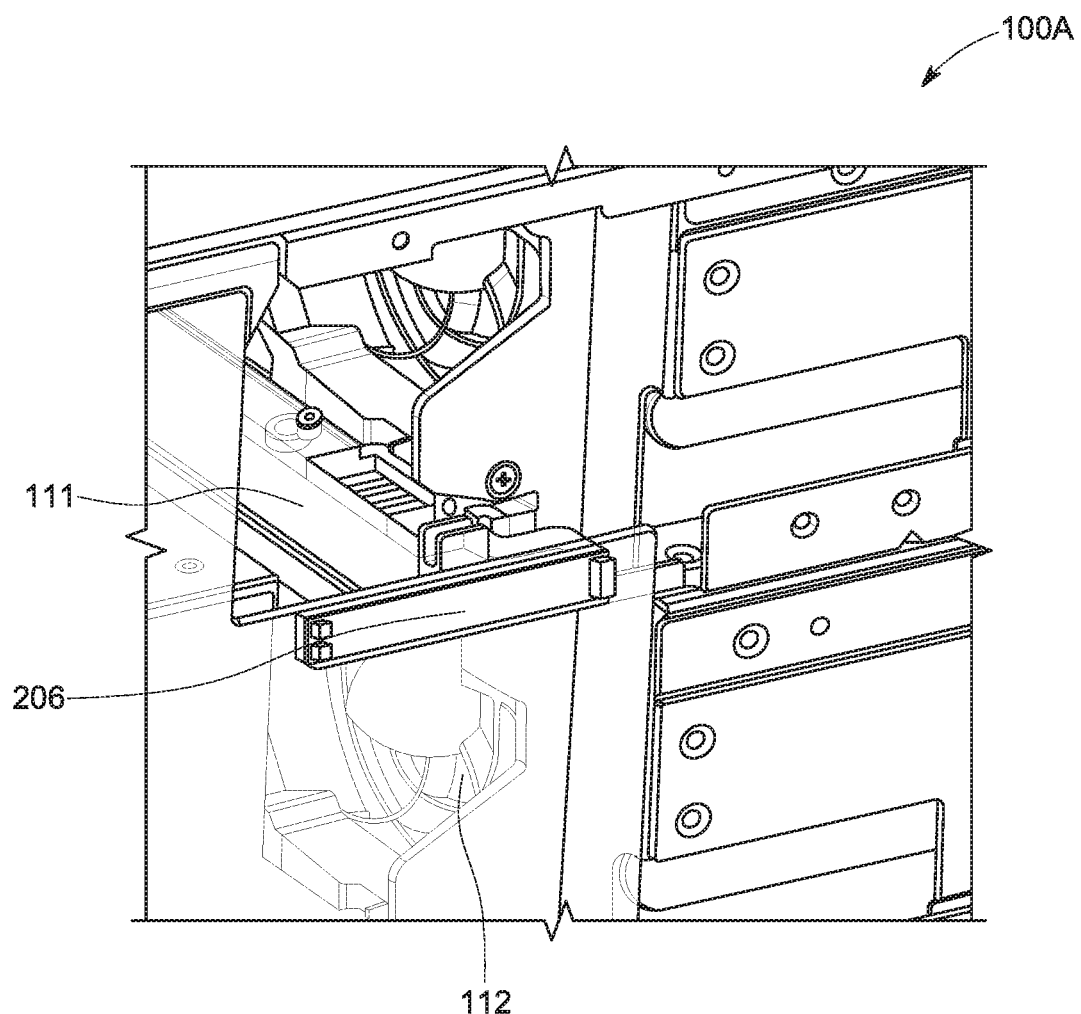

In the example of FIG. 1A, there are three fan boards 111 in the server system 100A, as illustrated in FIG. 2Q. Each fan board 111 is connected to the power linking board 112 via the power connector 206, as illustrated in FIG. 2R.

FIG. 2D illustrates two GPU modules 123 are being inserted from the front side of the server system 100A. Each of the GPU modules 123 comprises a linking BD 109 to be connected to the power linking board 112. FIG. 2E further illustrates connections between the linking BDs 109, and the power linking board 112 located on the second side of the server system 100A.

Figure 2S:
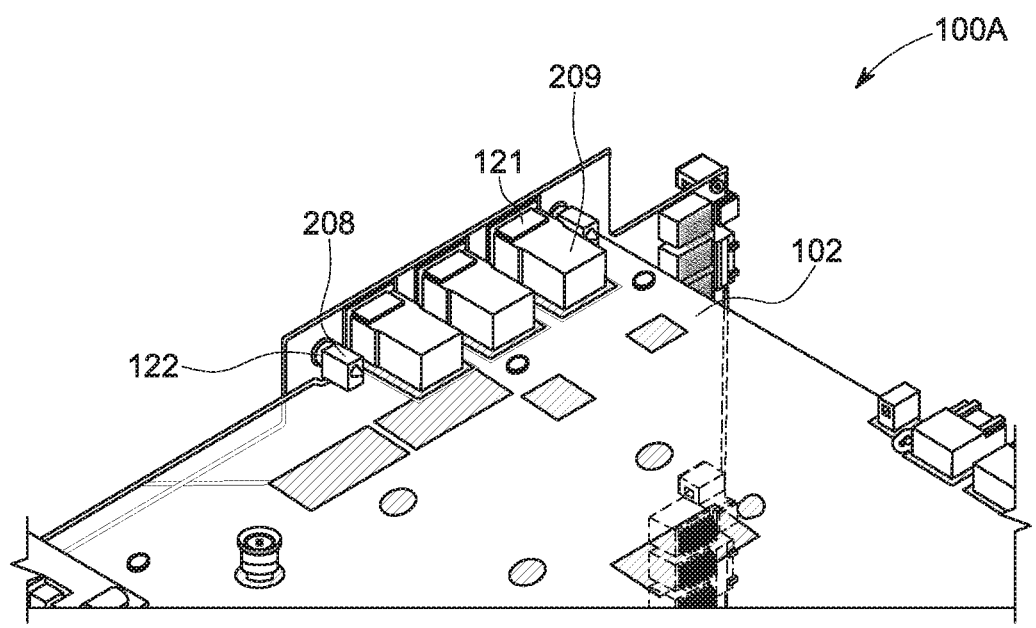
Figure 2T:
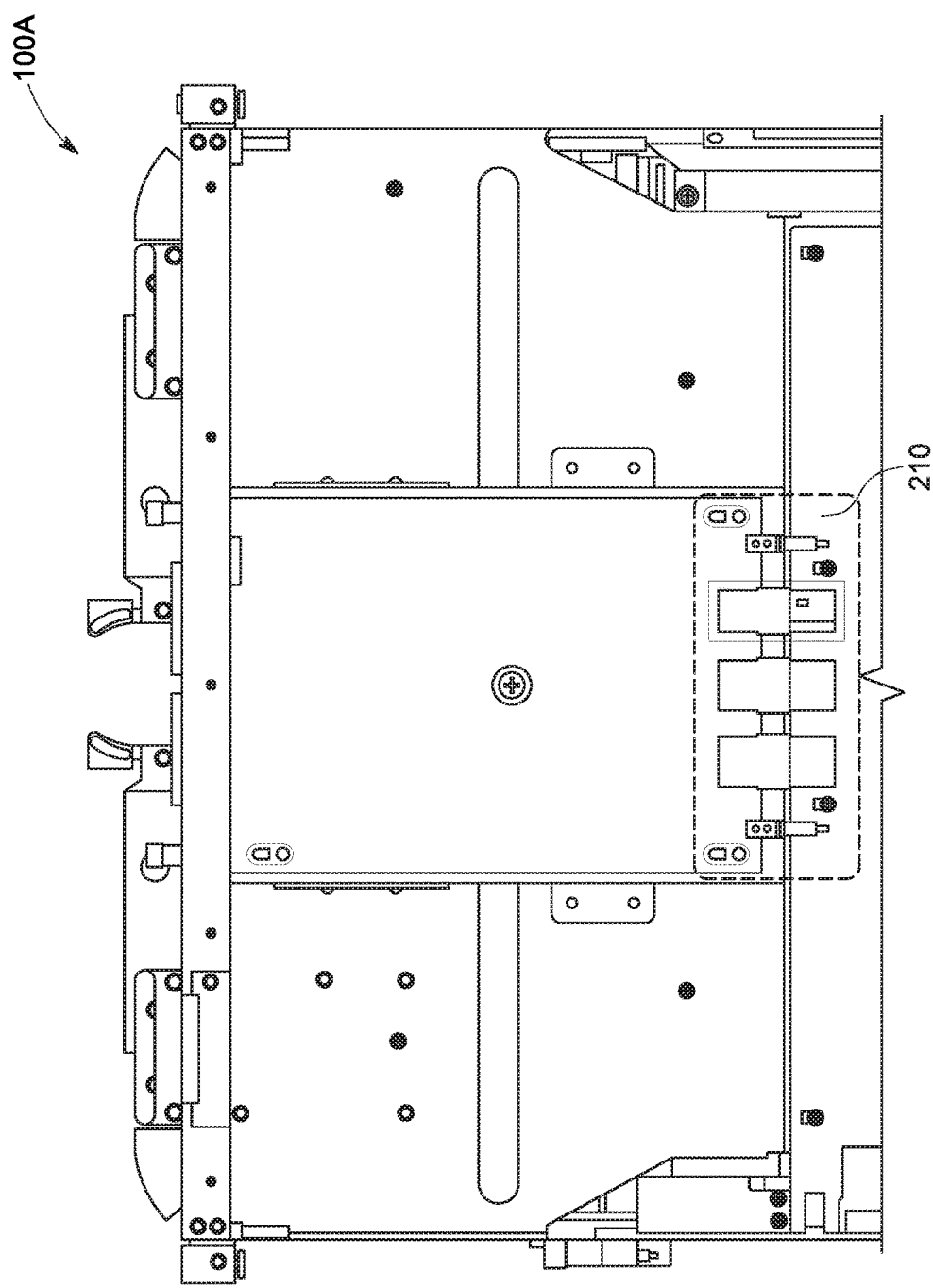
Figure 2U:
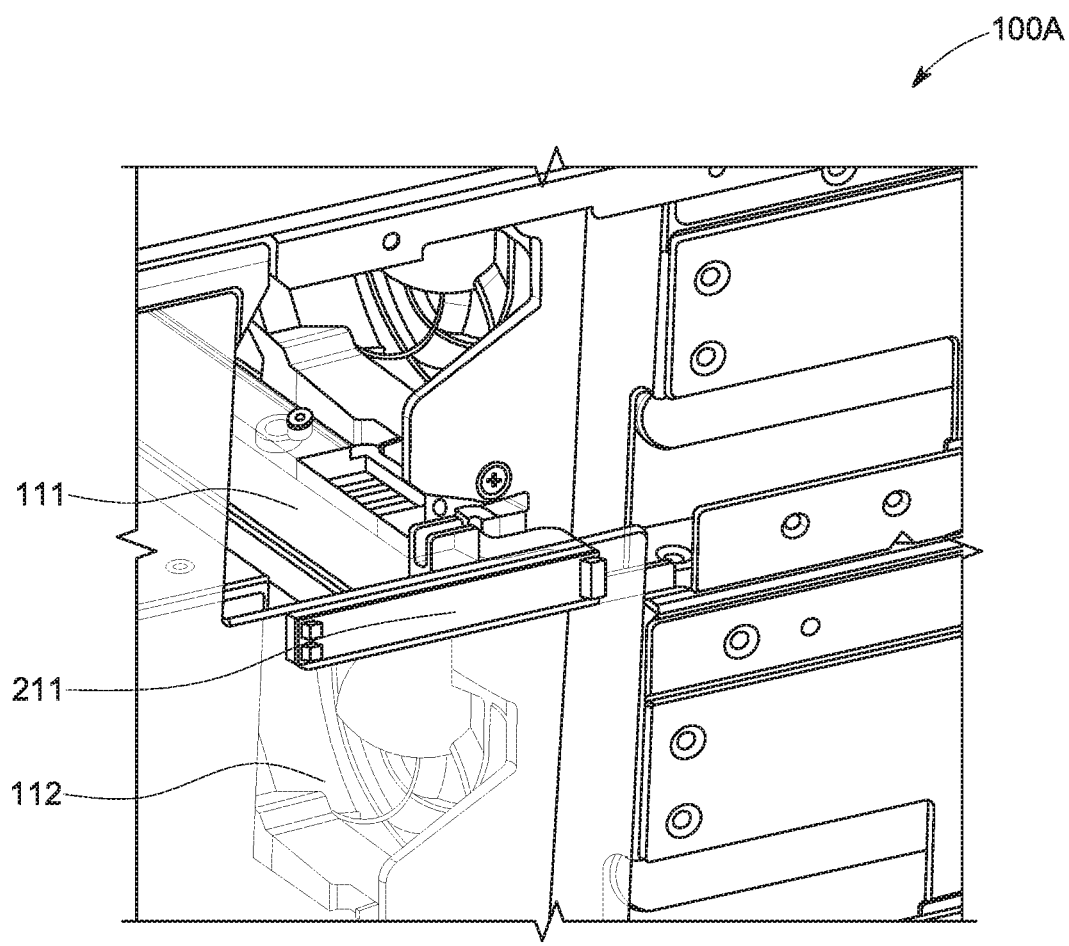

FIG. 2F illustrates a MB module 101 being inserted from the front side of the server system 100A while a fan bay main module 106 being inserted from the rear side of the server system 100A. The MB module 101 can be connected to the PDB module 102 via power connectors 210, as illustrated in FIG. 2T. In this example, the fan bay main module 106 comprises a plurality of fans (e.g., 106-1). The fan bay main module 106 can be inserted into the system 100A from the rear side, and move leftward to be connected with the power linking board 112. The fan board 111 and the power linking board 112 are connected via fan power connectors 211, as illustrated in FIG. 2U.

FIG. 2G illustrates a fan board 111 being inserted from the rear side of the server system 100A. The fan board 111 is connected to the power linking board 112 via fan power connectors 120 on the fan board 111 and the power connectors 121 (e.g., AirMax connectors) on the power linking board 112. In some examples, the power connectors 121 of the power linking board 112 can also be used to connect to AirMax Power Connector 209 of the PDB module 102, as illustrated in FIG. 2S. In this example, guiding pins 122 and guiding holder 208 can also be used to facilitate connections between the power linking board 112 and the PDB module 102.

Figure 2V:
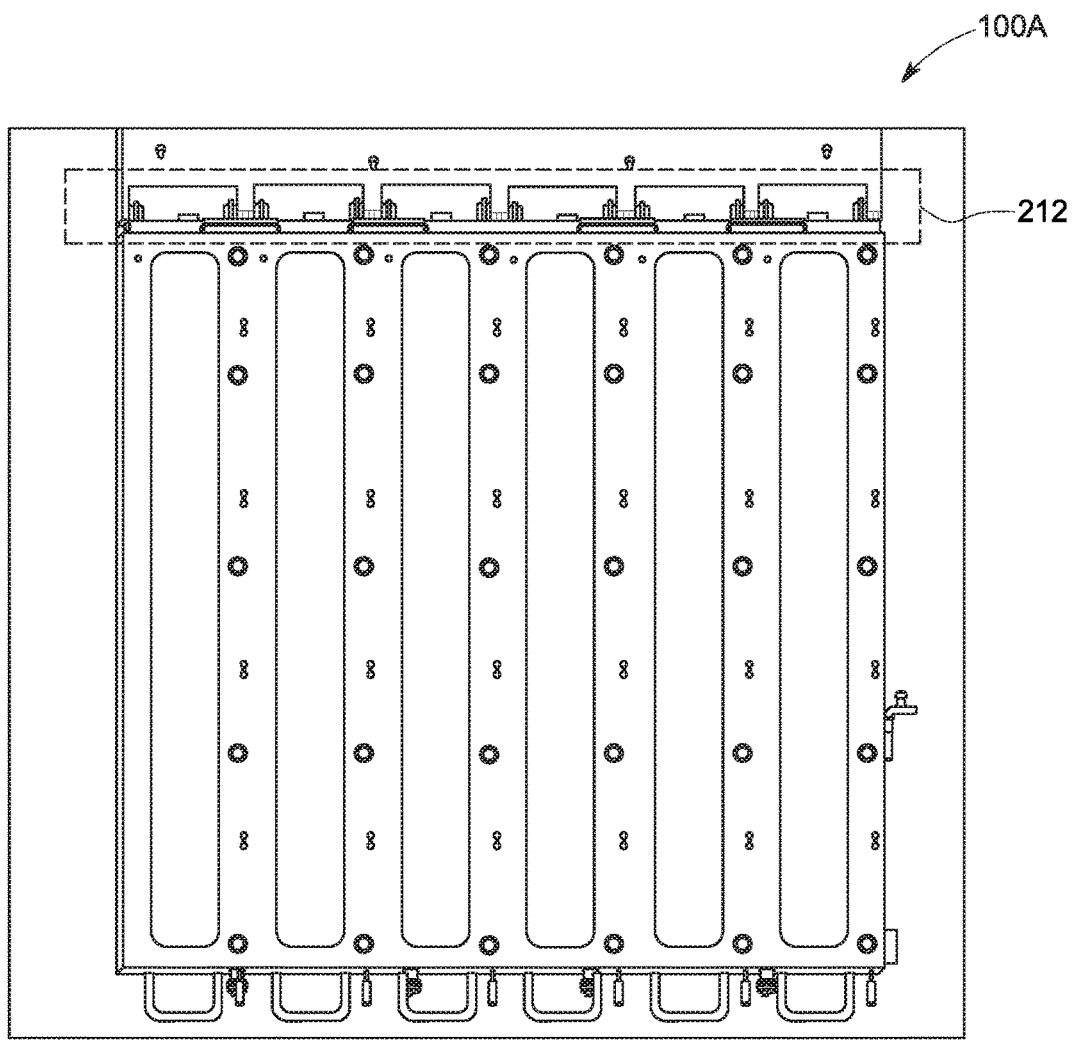

FIG. 2H illustrates the plurality of PSU modules 105 being inserted from the rear side of the server system 100A. In this example, PSU modules 105 are linked via PSU connector 212 in the PDB module 102, which is illustrated in FIG. 2V.

FIG. 2I further illustrates the server system 100A comprising the MB module 101, the GPU modules 123, the PDB module 102, the PSU modules 105, the fan bay main module 106, the power linking module 112, and the linking BDs.

As illustrated above in FIGS. 2A thru 2V, the plurality of circuit boards can be used to set a cableless topology in the server system 100A. The above discussion is meant to be illustrative of the principles and various examples of the present disclosure. Numerous variations and modifications will become apparent once the above disclosure is fully appreciated.

Figure 3:
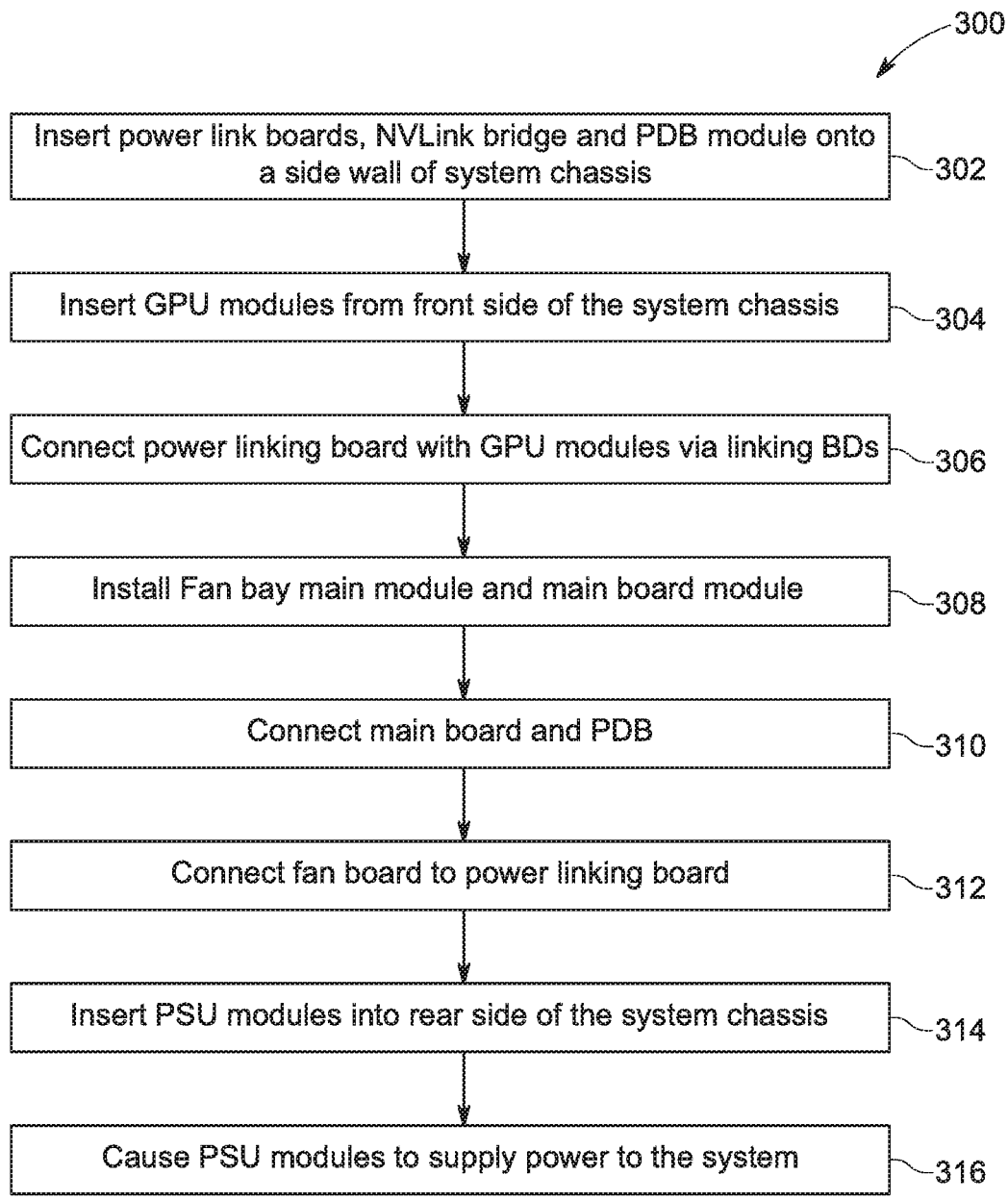
FIG. 3 is an exemplary method for assembling a cableless server system, in accordance with an implementation of the present disclosure.

FIG. 3 is an exemplary method 300 for assembling a cableless server system, in accordance with an implementation of the present disclosure. It should be understood that the exemplary method 300 is presented solely for illustrative purposes, and that other methods in accordance with the present disclosure can include additional, fewer, or alternative steps performed in similar or alternative orders, or in parallel. The exemplary method 300 starts at step 302 by inserting a power linking board, a plurality of NVLink bridges, and a PDB module onto a first side wall, a second side wall, and a rear side of the server system, respectively. The PDB module is connected to the power liking board via high speed orthogonal connectors, as illustrated in FIGS. 2A and 2B.

In some implementations, the server system comprises a MB module, PSU modules, NIC modules, fan modules, GPU modules, and a HGX platform. Components of the server system are interconnected via a main board, linking BDs, a PDB, a fan board, the power linking board, a PCIe expander board, the plurality of NVLink bridges, and a HGX base board.

At step 304, the GPU modules are inserted from a front side of the server system, as illustrated in FIG. 2D. Each of the GPU modules comprises a linking BD. At step 306, the power linking board is connected to a corresponding linking BD of each of the GPU modules, as illustrated in FIG. 2E.

At step 308, a fan bay main module, and the MB module are installed onto the server system, as illustrated in FIG. 2F. The fan bay main module comprises a plurality of fan modules. At step 310, the main board is connected to the PDB.

At step 312, the fan board is connected to the power linking board, as illustrated in FIG. 2G. In some implementations, the fan board is connected to the power linking board via fan power connectors of the fan board and power connectors of the power linking board.

At step 314, the PSU modules are inserted into the rear side of the server system, as illustrated in FIG. 2G. At step 316, the PSU modules are connected to an A/C power source to deliver power to the server system.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A computer-implemented method for assembling a cableless server system, comprising: inserting a power distribution board (PDB) module, a power linking board, and a plurality of NVLink bridges onto a first side, a second side, and a rear side of the cableless server system, respectively; the cableless server system comprising a motherboard (MB) module, power supply unit (PSU) modules, network interface controller (NIC) modules, fan modules, graphic process unit (GPU) modules, and a hyperscale GPU accelerator (HGX) platform, wherein components of the cableless server system are interconnected via a main board, linking boards (BDs), a PDB, a fan board, the power linking board, a peripheral-component-interconnect-express (PCIe) expander board, the plurality of NVLink bridges, and a HGX base board; inserting the GPU modules from a front side of the cableless server system, each of the GPU modules comprising a linking board; connecting the power linking board to a corresponding linking board of each of the GPU modules; installing a fan bay main module from the rear side of the cableless server system, and the MB module from the front side of the cableless server system; connecting the main board to the PDB; connecting the fan board to the power linking board; inserting the PSU modules into the rear side of the cableless server system; and connecting the PSU modules to an AC power source to deliver power to the cableless server system.

2. The computer-implemented method of claim 1, wherein the PDB module and the power linking board are connected via high speed orthogonal connectors.

3. The computer-implemented method of claim 1, wherein each of fan power connectors of the fan board the power linking board is connected to a corresponding power connector on the power linking board.

\* \* \* \* \*